(12) United States Patent  
Ayotte et al.

(10) Patent No.: US 9,190,375 B2  
(45) Date of Patent: Nov. 17, 2015

(54) SOLDER BUMP REFLOW BY INDUCTION HEATING

(71) Applicant: International Business Machines Corporation, Armonk, NY (US)

(72) Inventors: Stephen P. Ayotte, Bristol, VT (US); Sebastien S. Quesnel, Quebec (CA); Glen E. Richard, Burlington, VT (US); Timothy D. Sullivan, Underhill, VT (US); Timothy M. Sullivan, Essex, VT (US)

(73) Assignee: GlobalFoundries, Inc., Grand Cayman (KY)

( * ) Notice: Subject to any disclaimer, the term of this patent is extended or adjusted under 35 U.S.C. 154(b) by 0 days.

(21) Appl. No.: 14/248,373

(22) Filed: Apr. 9, 2014

(65) Prior Publication Data

US 2015/0294948 A1      Oct. 15, 2015

(51) Int. Cl.  
*H01L 23/00* (2006.01)

(52) U.S. Cl.  
CPC ............... *H01L 24/13* (2013.01); *H01L 24/81* (2013.01); *H01L 2224/10156* (2013.01); *H01L 2224/10175* (2013.01); *H01L 2224/13022* (2013.01); *H01L 2224/13099* (2013.01); *H01L 2224/81222* (2013.01); *H01L 2224/81815* (2013.01); *H01L 2924/01022* (2013.01); *H01L 2924/01026* (2013.01); *H01L 2924/01027* (2013.01); *H01L 2924/01028* (2013.01); *H01L 2924/01073* (2013.01); *H01L 2924/01074* (2013.01); *H01L 2924/04941* (2013.01); *H01L 2924/04953* (2013.01); *H01L 2924/14* (2013.01)

(58) Field of Classification Search  
CPC ................... H01L 2924/00; H01L 2924/0105; H01L 2224/13655; H01L 24/81; H01L 2924/01027; H01L 2924/014; H01L 2224/81222; H01L 2224/97; H01L 2224/75264; H01L 2224/81815; H01L 2224/7525; H01L 2224/81191; H01L 24/13; H01L 2224/10175; H01L 2224/10156; H01L 2224/13099; H01L 2224/13022; H01L 2924/01028; H01L 2924/01026; H01L 2924/01

See application file for complete search history.

(56) References Cited

U.S. PATENT DOCUMENTS

| 3,391,846 A | 7/1968 | White |
| 3,902,940 A | 9/1975 | Heller, Jr. et al. |

(Continued)

FOREIGN PATENT DOCUMENTS

| EP | 0511305 B1 | 9/1998 |
| JP | 4985536 B2 | 7/2012 |
| JP | 5029279 B2 | 9/2012 |

*Primary Examiner* — Yasser A Abdelaziez  
*Assistant Examiner* — Farun Lu  
(74) *Attorney, Agent, or Firm* — Gibb & Riley, LLC; Anthony J. Canale (57) ABSTRACT

A method of applying inductive heating to join an integrated circuit chip to an electrical substrate using solder bumps including applying a magnetic field to a magnetic liner in thermal contact with a solder bump on the integrated circuit chip. The magnetic field causes Joule heating in the magnetic liner sufficient to melt the solder bump, which has a lower portion embedded in a first dielectric layer and an upper portion at least partially embedded in a second dielectric layer. The lower portion is in electrical contact with a conductive pad, the first dielectric layer is above the conductive pad and the second dielectric layer is on top of the first dielectric layer. The duration of application of the magnetic field is controlled to achieve a joining temperature that is approximately halfway between the storage and operating temperatures of the integrated circuit chip.

20 Claims, 9 Drawing Sheets

(56) References Cited

U.S. PATENT DOCUMENTS

| | | |
|---|---|---|
| 4,107,506 A | 8/1978 | Pelegri |
| 4,789,767 A | 12/1988 | Doljack |
| 4,795,870 A | 1/1989 | Krumme et al. |
| 4,852,252 A | 8/1989 | Ayer |
| 4,914,267 A | 4/1990 | Derbyshire |
| 4,983,804 A | 1/1991 | Chan et al. |
| 5,093,545 A | 3/1992 | McGaffigan |
| 6,288,376 B1 | 9/2001 | Tsumura |
| 6,878,909 B2 | 4/2005 | Bergstrom et al. |
| 6,991,967 B2 | 1/2006 | Liu et al. |
| 7,064,004 B2 | 6/2006 | Frutschy |
| 7,161,122 B2 | 1/2007 | DeBonis |
| 7,316,064 B2 | 1/2008 | Chou et al. |
| 7,332,411 B2 | 2/2008 | McKinnell et al. |
| 8,254,140 B2 * | 8/2012 | Lee et al. .............. 361/767 |
| 8,313,958 B2 | 11/2012 | Swaminathan et al. |
| 8,324,522 B2 | 12/2012 | Kim et al. |
| 8,420,989 B2 | 4/2013 | Kim et al. |
| 8,815,730 B1 * | 8/2014 | Wang et al. ........... 438/612 |
| 2004/0207086 A1 * | 10/2004 | Leuschner et al. ...... 257/758 |
| 2010/0099250 A1 * | 4/2010 | Jang et al. ............. 438/614 |

* cited by examiner

SOLDER BUMP REFLOW BY INDUCTION HEATING

BACKGROUND

The present invention relates to a fabricating a semiconductor package, and more particularly, to joining an integrated circuit chip to an electrical substrate by localized heating of one or more solder bumps.

An integrated circuit chip (hereinafter "chip") may be joined to an electrical substrate (hereinafter "substrate") using a plurality of solder connections to form a semiconductor package. The chip may generally be silicon and the substrate may be a composite substrate, a laminate substrate, or an organic laminate substrate. The solder connection may generally be formed from a lead-free tin based solder alloy.

An example of the solder connection includes controlled collapse chip connection (also known as C4 or flip-chip connection). Generally, solder connections may include an array of small solder balls on the surface of the chip before the chip is joined to the substrate. More specifically, each individual solder connection may include a bonding pad on the chip, a solder bump, and a corresponding bonding pad on the substrate. A typical joining sequence may begin with depositing or applying a plurality of solder bumps on a plurality of bonding pads on the chip. The plurality of solder bumps are then heated to a temperature sufficient to cause them to reflow. Next, the chip, including the plurality of solder bumps, is aligned to and placed on a chip site on the substrate. In doing so, the plurality of solder bumps contact a plurality of corresponding bonding pads on the substrate. The plurality of solder bumps are again heated to a temperature sufficient to cause them to reflow. The final solder connections may electrically connect and physically join the chip to the substrate to create a semiconductor package.

As presently practiced, techniques used to form the solder connection and join the chip to the substrate may subject the components of that package to a joining temperature in excess of 240° C. for as long as a few minutes. The joining temperature should be high enough to cause the solder alloy to reflow and join the chip to the substrate, as described above. In general, the chip and the substrate may have very different coefficients of thermal expansion (CTE). When the semiconductor package is cooled from the joining temperature to room temperature, the substrate may shrink more than the chip. This mismatch between coefficients of thermal expansion may cause some of the solder connections to experience shear stress proportional to the difference in the displacements of the chip relative to the substrate. Generally, solder connections located at or near a perimeter of the package experience the most stress. The shear stresses may be large enough to deform the solder connection and sometimes even cause the solder alloy to separate from the chip. In some instances, the solder connections may remain physically connected to the chip and the shear stresses may cause a top part of the chip to crack, in turn breaking wiring layers. Sometimes cracks may extend into the chip and cause further failures and defects.

SUMMARY

According to an embodiment of the invention, a method of applying inductive heating to join an integrated circuit chip to an electrical substrate using solder bumps is provided. The method may include applying a magnetic field to a magnetic liner in thermal contact with a solder bump on the integrated circuit chip, the magnetic field causes Joule heating in the magnetic liner sufficient to melt the solder bump, the solder bump comprising a lower portion embedded in a first dielectric layer and an upper portion at least partially embedded in a second dielectric layer, the lower portion is in electrical contact with a conductive pad, the first dielectric layer is above the conductive pad and the second dielectric layer is on top of the first dielectric layer.

According to another embodiment of the invention, a method is provided. The method may include forming a solder bump on an integrated circuit chip, the solder bump comprising a lower portion embedded in a first dielectric layer and an upper portion at least partially embedded in a second dielectric layer, the lower portion is in electrical contact with a conductive pad, the first dielectric layer is above the conductive pad and the second dielectric layer is on top of the first dielectric layer, and forming a magnetic liner in thermal contact with the solder bump, the magnetic liner comprises a magnetic permeability greater than or equal to 100.

According to another embodiment of the invention, a structure is provided. The structure may include a solder bump on an integrated circuit chip, the solder bump comprising a lower portion embedded in a first dielectric layer and an upper portion at least partially embedded in a second dielectric layer, the lower portion is in electrical contact with a conductive pad, the first dielectric layer is above the conductive pad and the second dielectric layer is on top of the first dielectric layer, and a magnetic liner in thermal contact with the solder bump, the magnetic liner comprises a magnetic permeability greater than or equal to 100.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates to a fabricating a semiconductor package, and more particularly, to joining an integrated circuit chip to an electrical substrate by localized heating of one or more solder bumps. The ability to achieve localized heating of the solder bumps can minimize any thermal affects the heating technique may have on the integrated circuit chip, the electrical substrate, or the package as a whole. One way to achieve localized heating of the solder bumps may include supplementing the structural configuration of the solder bumps with a magnetic liner used in conjunction with an induction heating technique. One embodiment by which to achieve localized heating of the solder bumps is described in detail below by referring to the accompanying drawings FIGS. 1-5.

Figure 1:
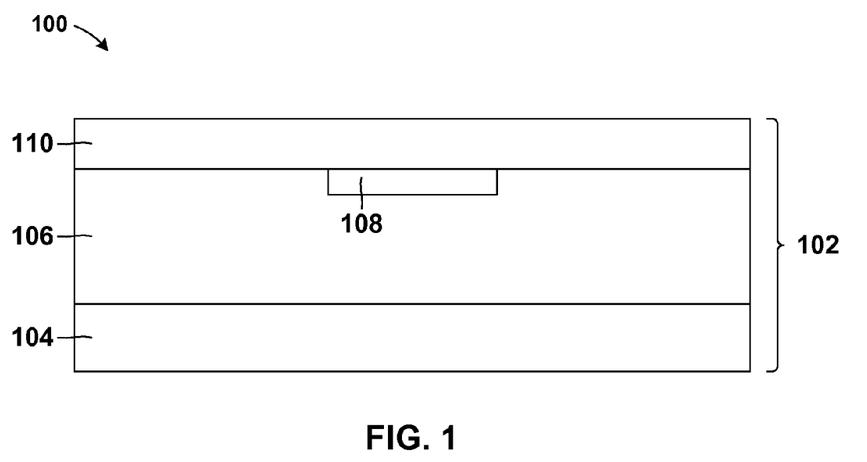
FIG. 1 illustrates a back-end-of-line layer and a first dielectric layer above a substrate according to an exemplary embodiment.

Referring now to FIG. 1, an intermediate step in the fabrication of a structure 100 including a solder bump. The solder bump may be capable of localized heating during an induction heating technique, is shown according to one embodiment. Generally, the structure 100 may include many solder bumps fabricated on a back side of a semiconductor wafer. For purposes of the present description, fabrication of a single solder bump will be illustrated in the figures and described below. The structure 100 may include an integrated circuit chip 102 (hereinafter "chip") having a substrate 104 and a back-end-of-line interconnect level 106 (hereinafter "BEOL level").

The substrate 104 may be a bulk semiconductor including, for example, Si, SiGe, SiC, SiGeC, GaAs, InP, InAs and other III-V compound semiconductors, III-V compound semiconductors, or layered semiconductors such as, for example, silicon-on-insulators (SOI), SiC-on-insulator (SiCOI) or silicon germanium-on-insulators (SGOI). For purposes of description, the substrate 104 may include a silicon containing semiconductor material such as a single crystal silicon. The substrate 104 may be doped or undoped. Also, the substrate 104 may be strained, unstrained or a combination thereof.

The BEOL level 106 may include a plurality of dielectric layers (not shown) as well as one or more conductive pads 108 (hereinafter "conductive pad") embedded as metallization in one or more of the dielectric layers. The dielectric layers may include any type of dielectric material used for insulating a semiconductor device known to a person of ordinary skill in the art including, for example, a silicon dioxide substrate, a fluorinated silicon dioxide substrate, a silicon glass substrate.

The conductive pad 108 may include any type of conductive material known to a person of ordinary skill in the art including, for example, copper, aluminum, or tungsten. In an embodiment, the conductive pad 108 may include a conductive line or a conductive layer. The conductive pad 108 may be formed within the BEOL level 106 using any fabrication technique known to a person of ordinary skill in the art including, for example, a damascene technique. An upper surface of the conductive pad 108 may be made substantially flush with an upper surface of the BEOL level 106 using any polishing technique known in the art, such as, for example, a chemical mechanical polishing technique.

A first dielectric layer 110 may be formed above the BEOL level 106 and cover the conductive pad 108. The first dielectric layer 110 may include any of several dielectric materials, for example, oxides, nitrides and oxynitrides of silicon. The dielectric material may also include oxides, nitrides and oxynitrides of elements other than silicon. The first dielectric 110 may be deposited on the BEOL level 106 using any technique known to a person of ordinary skill in the art including, for example, a chemical vapor deposition process.

It should be noted that the first dielectric layer 110, while only depicted as a single layer, may include a plurality of layers. Typically, in a multilayer dielectric structure at this level, the first dielectric layer 110 may include a thin copper capping layer of nitride or similar composition and have a thickness ranging from about 10 nm to about 100 nm. The first dielectric layer 110 in this case may include one or more layers of oxide and/or nitride dielectric with any/each of these layers having a thickness ranging from about 0.5 μm to 1.0 μm. The multiple layers of the first dielectric layer 110 may typically have a thickness ranging from about 1.0 μm to about 1.5 μm.

Figure 2:
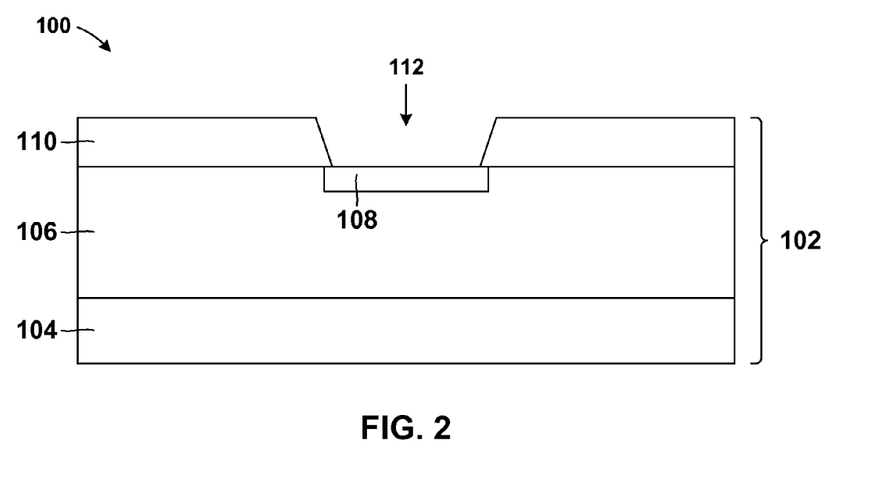
FIG. 2 illustrates patterning the first dielectric layer according to an exemplary embodiment.

Referring now to FIG. 2, a first opening 112 may be formed in the first dielectric layer 110. The first opening 112 may be aligned with the conductive pad 108. More specifically, the first opening 112 may preferably expose the conductive pad 108. The opening 112 may be formed in preparation for forming an electrical connection to the conductive pad 108. The first opening 112 may be formed using any technique known to a person of ordinary skill in the art including, for example, creating a pattern using a standard photoresist process and transferring the pattern to the first dielectric layer 110 by a reactive ion etch (RIE) technique using a standard fluorine-containing RIE chemistry. Portions of the first dielectric layer 110 may be stripped away, to create the first opening 112 using standard techniques known to a person of ordinary skill in the art. The first opening 112 may alternatively be referred to as a via opening. In an embodiment, the first opening 112 may have a diameter or width less than the conductive pad 108.

Figure 3:
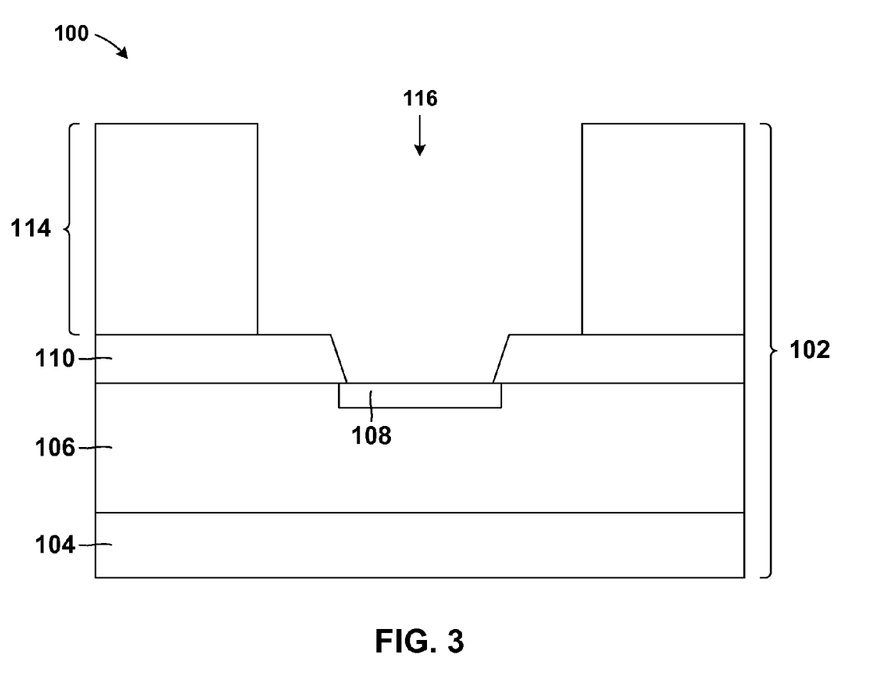
FIG. 3 illustrates forming and patterning a second dielectric layer according to an exemplary embodiment.

Referring now to FIG. 3, a second dielectric layer 114 may be deposited above the structure 100 and then subsequently patterned to create a second opening 116. It should be noted that one or more field openings located elsewhere on the structure may be formed at same time as the second opening 116. The field openings may serve a variety of functions, such as, for example, fabricating an island structure from the second dielectric layer 114 surrounding the second opening 116. The second dielectric layer 114 may include any dielectric material including, for example, a polyimide dielectric material (including a photo-sensitive polyimide dielectric material) or an organic dielectric material. The second dielectric layer 114 may be deposited using any technique known to a person of ordinary skill in the art including, for example, a standard spin-on technique. In an embodiment, the second dielectric layer 114 may have a thickness greater than about 10 μm. In an embodiment, the second dielectric layer 114 may have a thickness ranging from about 0.01 μm to about 100 μm. In all cases the second dielectric layer 114 may preferably be thick enough, and as such thicker than typically used, to allow for a material to be subsequently deposited along a vertical side wall of the second opening 116. Stated differently, the second dielectric layer 114 may be thicker than typically used in the fabrication of a typical solder bump.

After being deposited, the second dielectric layer 114 may be patterned to form the second opening 116 using any photolithographic technique known to a person of ordinary skill in the art as described above with reference to the first opening 112 (FIG. 2). In the present case, the second opening 116 may be aligned with the first opening 112 (FIG. 2), and as such aligned with the conductive pad 108. The second opening 116 may have a diameter or width large enough to subsequently fill with a solder alloy to form a solder bump. In an embodiment, the second opening 116 may have a diameter or width larger than the conductive pad 108. In an embodiment, the second opening 116 may have a diameter or width ranging from about 20 μm to about 100 μm.

Figure 4:
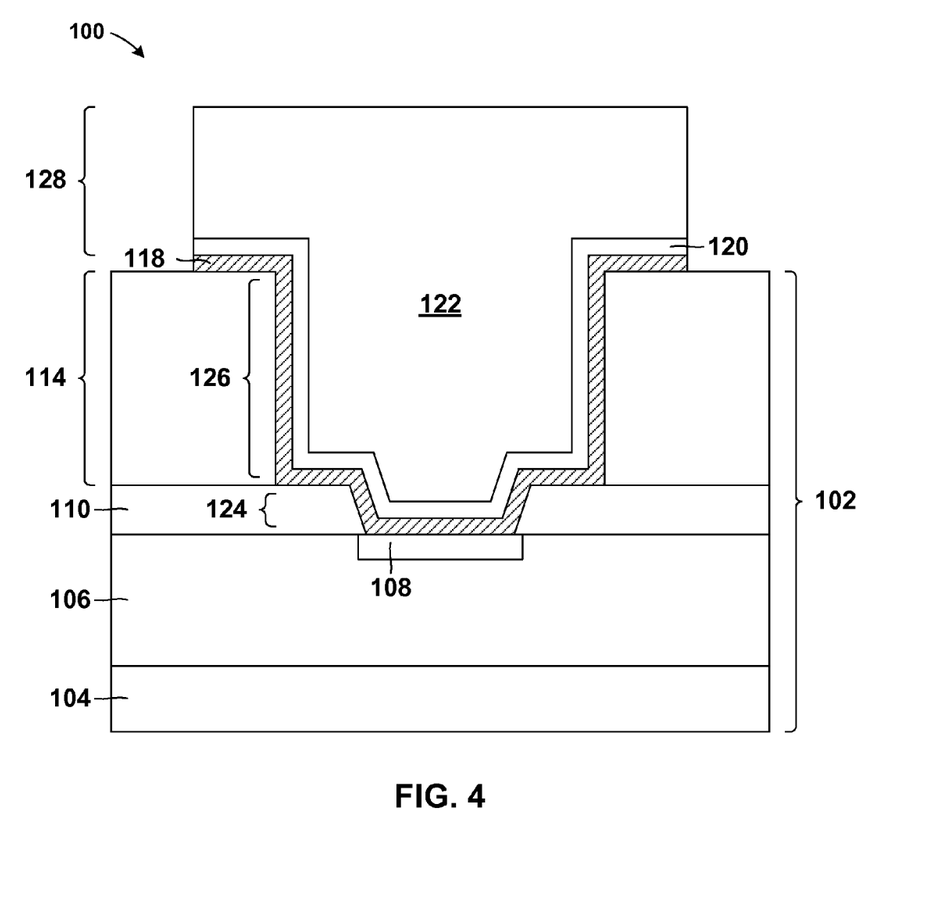
FIG. 4 illustrates forming a magnetic liner and a barrier layer, and depositing a solder alloy according to an exemplary embodiment.

Referring now to FIG. 4, a magnetic liner 118 may be deposited above the second dielectric layer 114. In doing so, the magnetic liner 118 may be deposited within the first opening 112 (FIG. 2) and the second opening 116 (FIG. 3), and on top of the conductive pad 108. In an embodiment, as illustrated, the magnetic liner 118 is a single layer in direct contact with, and electrically connected to, the conductive pad 108. In another embodiment, the magnetic liner 118 may include multiple layers of the same or of different magnetic materials. The magnetic liner 118 may include any magnetic material having a magnetic permeability that interacts with the magnetic field applied to produce sufficient heat. In an embodiment, the magnetic liner 118 may include any magnetic material having a magnetic permeability greater than or equal to about 100. The magnetic liner 118 may include, for example, nickel, cobalt, iron, or any suitable combination thereof. Suitable materials to be used for the magnetic liner 118 may include materials that may be deposited within the first and second openings 112, 116 (FIGS. 2 and 3) without damaging or compromising the functionality of the structure 100 existing at the time of deposition.

In an embodiment, the magnetic liner 118 may have a thickness ranging from about 0.01 μm to about 2 μm. The magnetic liner 118 may be deposited over the second dielectric layer 114 using any conformal deposition technique known to a person of ordinary skill in the art including, for example, a sputter deposition technique.

Next, a barrier layer 120 may be deposited above the magnetic liner 118 to protect the magnetic liner 118 from alloying with a solder alloy that may be subsequently deposited within the second opening 116 (FIG. 3). The barrier layer 120 may include any metallic conductive material including, for example, tantalum, tantalum nitride, titanium, titanium nitride, tungsten, or any combination thereof. The barrier layer 120 may have a thickness ranging from about 0.01 μm to about 2 μm. The barrier layer 120 may be deposited above the magnetic liner 118 using any deposition technique known to a person of ordinary skill in the art including, for example, a sputter deposition technique. In an embodiment, the barrier layer 120 may include a layer of tantalum nitride or a layer of titanium nitride. In another embodiment, the barrier layer 120 may include a layer of tantalum and a layer of tantalum-nitride having a total thickness ranging from about 0.01 μm to about 2 μm. As stated above, the barrier layer 120 may prevent the magnetic liner 118 from forming an alloy with any material, for example tin in a lead-free solder alloy, that may be subsequently deposited within the second opening 116.

Finally, a mask may be applied and a solder alloy 122, may be deposited above the barrier layer 120, and within the second opening 116 (FIG. 3) according to any technique known to a person or ordinary skill in the art. The solder alloy 122 may alternatively be referred to as a solder bump or a lead-free solder bump. In an embodiment, the solder alloy 122 may include any lead-free solder alloy including, for example, tin, silver, or any combination thereof. The solder alloy 122 may be deposited above the barrier layer 120, and within the second opening 116 (FIG. 3) using any electrodeposition technique known in the art. In the present embodiment, an upper surface of the solder alloy 122 may extend above an upper surface of the second dielectric layer 114. In an alternative embodiment, the upper surface of the solder alloy 122 may be substantially flush with the upper surface of the second dielectric layer 114. Furthermore, a sidewall and a bottom of the solder alloy 122 may be surrounded by both the magnetic liner 118 and the barrier layer 120. In some cases, the solder alloy 122 may have a generally cylindrical shape.

With continued reference to FIG. 4, a final structure 100 is shown. Due to the configuration of the first and second dielectric layers 110, 114, and the first and second openings 112, 116 (FIGS. 2 and 3), the structure 100 may have a first portion 124, a second portion 126, and a third portion 128. The first portion 124 of the structure 100 may include a first portion of the magnetic liner 118, a first portion of the barrier layer 120, and a first portion of the solder alloy 122 located or positioned within the first dielectric layer 110. The second portion 126 of the structure 100 may include a second portion of the magnetic liner 118, a second portion of the barrier layer 120, and a second portion of the solder alloy 122, located or positioned within the second dielectric layer 114. The third portion 128 of the structure 100 may include a third portion of the magnetic liner 118, a third portion of the barrier layer 120, and a third portion of the solder alloy 122, may be generally located or positioned above the second dielectric layer 114.

In the present example, the first portion of the magnetic liner and the first portion of the barrier layer may generally line the bottom of the solder alloy 122. Similarly, the second portion of the magnetic liner and second portion of the barrier layer may generally line the sidewall of the solder alloy 122.

Figure 5:
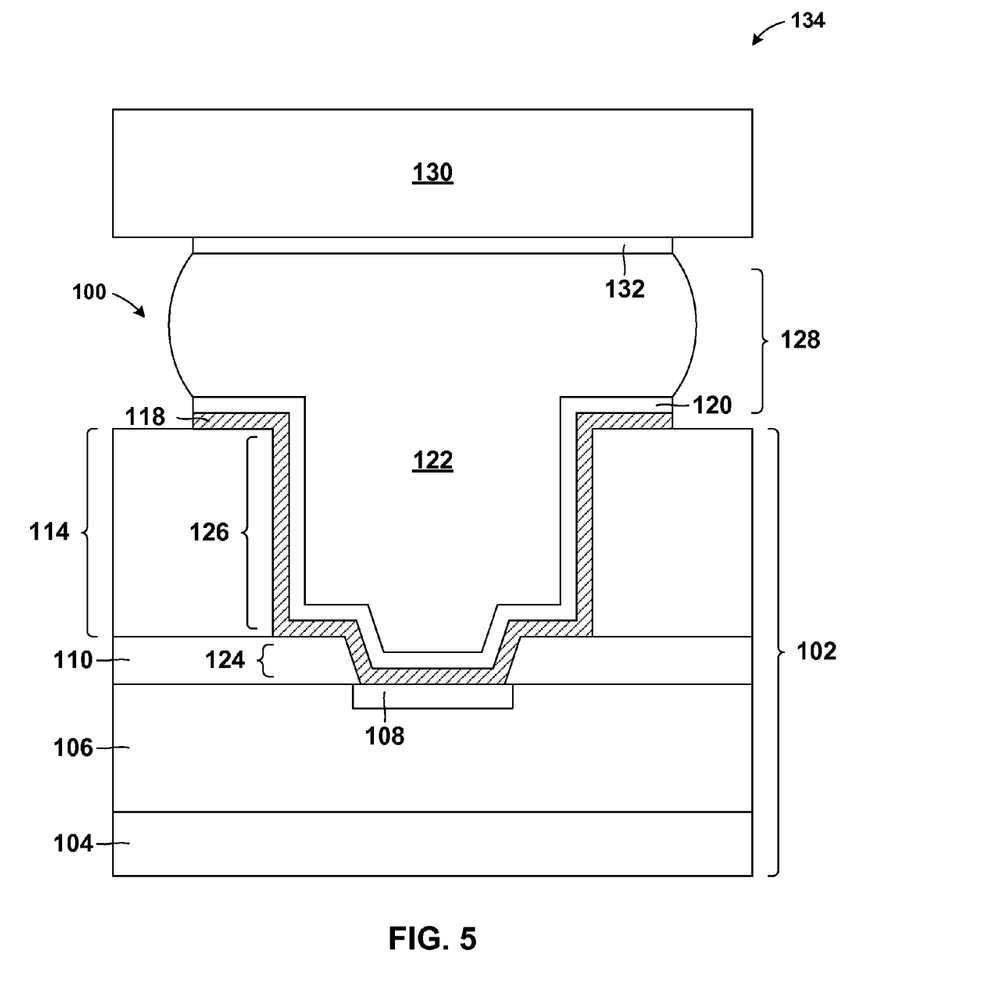
FIG. 5 illustrates forming a solder connection between a chip and a substrate according to an exemplary embodiment.

Referring now to FIG. 5, the final structure 100 may be used in combination with an induction heating technique to achieve localized heating of the solder alloy 122 to form a solder connection between, for example, the chip 102 and an electrical substrate 130 (hereinafter "substrate") including a corresponding bonding pad 132. The chip 102, the substrate 130, and the solder connection there between may be referred to collectively as a semiconductor package 134 (hereinafter "package"). For purposes of this description, heating of the solder alloy 122 may include heating of the package 134, and vice versa. Additionally, the solder connection between the chip 102 and the substrate 130 may include the conductive pad 108, the magnetic liner 118, the barrier layer 120, and the bonding pad 132. The induction heating of the solder alloy 122 may be highly localized as a result of the careful placement of the magnetic liner 118 as will be described in more detail below.

The induction heating technique used to achieve localized heating of the solder alloy 122 will preferably melt the solder alloy 122 without unduly heating the chip 102 or the substrate 130. Doing so may minimize any thermal expansion mismatch between the chip 102 and the substrate 130. Inductive heating uses magnetic fields to induce currents in ferromagnetic materials, for example the magnetic liner 118. Heat generated in the magnetic liner 118 may be transferred to the solder alloy 122 by way of thermal conduction. Heat conducted from the magnetic liner 118 may be sufficient to melt the solder alloy 122. Therefore during induction heating, the chip 102 and the substrate 130 may only experience conductive heating resulting from their contact with the magnetic liner 118 and/or the solder alloy 122. By using an induction heating technique the chip 102 and the substrate 130 do not experience convective heating as with a typical oven heating technique. Therefore, excessive heat transfer into the chip 102 and the substrate 130 can be managed by using an induction heating technique.

In addition, the induction heating technique may be specifically tuned to supply just enough heat to the chip 102 and the substrate 130 to achieve a zero-stress temperature, or a temperature halfway between a storage temperature and an operating temperature. For example, the operating temperature of a package may be about 125° C., and the storage temperature of a package may be about 25° C. Joining the chip 102 to the substrate 130 at the zero-stress temperature, or about 75° C. may minimize the stress on the solder bumps by decreasing the range of temperature fluctuation by half. In the present example, if the chip 102 may be typically joined to the substrate 130 at or around the storage temperature of about 25° C., then the range of temperature fluctuation may be reduced from about 100° C. to about 50° C.

Although inductive heating has been known for years and has been used extensively to melt and shape parts since the 1940's, it has not been applied to joining a chip to a substrate using a solder connection. One reason for this may include the fact that current use of reflow oven heating techniques have been an efficient and a cost effective way to form a solder connection using lead based solder alloys and solder bump diameters greater than or equal to about 100 µm. Unfortunately, lead based solder alloys have widely been substituted or replaced by lead-free solder alloys, for example tin based solder alloys. In addition, a demand for smaller package size has influenced solder bump diameters to decrease in size. The prevailing use of lead-free solder alloys and smaller solder bumps present challenges to current reflow oven heating techniques.

Previously used lead based solder alloys are relatively ductile and may easily deform when subjected to mechanical stress. Conversely, newer lead-free solder alloys, for example tin based solder alloys, are less ductile than lead based solder alloys. As such, traditional lead based solder alloys may have been more forgiving to the thermal expansion mismatch between an integrated circuit chip and an electronic substrate. Therefore, packages including small solder connections made with a lead-free solder alloy may be susceptible to cracking and separation. In addition, smaller solder bump sizes may concentrate stress created by the thermal expansion mismatch between a chip and a substrate on smaller areas, thus increasing the probability of cracking in the chip.

Traditional industrial uses for inductive heating may have focused on work pieces of macroscopic dimensions, ranging from fractions of an inch to tens of inches. Heating objects of this size may generally require use of induction frequencies ranging from 60 Hz to hundreds of kHz. The smaller the work piece, the higher the induction frequency needed for efficient heating. In the present case, efficient coupling between the induction heating technique and the chosen solder alloy is important to melt the solder alloy quick enough to prevent transferring excess heat into the chip or the substrate. For example, if the chip has metallization insulator layers that amount to about 10 µm thick, the insulator, such as, for example silicon dioxide, may act as a thermal insulator between the solder alloy 122 and the chip beneath the circuitry. For example, thermal energy travels through the silicon oxide layer at approximately 0.5 µm to approximately 1 µm per µs, therefore a front edge of a heat pulse generated on an upper surface of the silicon oxide layer may reach the silicon chip in about 20 µs. Consequently, to minimize the heat transfer into the chip, the solder alloy should be melted in about 20 µs. It should be noted that some heating of either the chip or the substrate may be desirable in order to join the assembly at the zero-stress temperature. The amount of heat desired would depend on the heat capacity and volume of both the chip and the substrate, and any thermal resistances between them and the melting solder alloy.

Induction heating is the process of heating an electrically conductive object by electromagnetic induction, where eddy currents, or electrical currents, are generated within the object, and resistance leads to Joule heating of the object. An induction heater includes an electromagnet, through which a high-frequency alternating current (AC) is passed. The frequency of the AC used depends on the object size, the object material, coupling (between the work coil or electromagnet and the object to be heated) and the skin depth.

Skin depth may refer to a depth in the conductive object at which most of the electric current flows during induction heating. The skin depth may depend on a material's resistivity and magnetic permeability, and on the induction frequency. The skin depth is inversely proportionally to the square root of the magnetic permeability and the induction frequency. As such, an increase in magnetic permeability will decrease the skin depth. Furthermore, the skin depth is proportional to the square root of the material's resistivity. As such, a decrease in resistivity will decrease the skin depth. Thus, the heating efficiency improves as the skin depth decreases because it increases the current density.

Careful selection of materials will result in improvements in the induction heating process used to melt the solder alloy. For example, it may be possible to decrease the skin depth by selecting materials with a higher magnetic permeability, thus resulting in lower induction frequencies and shorter melting times.

For example, while it may be feasible to melt a 100 µm diameter lead-free or tin solder alloy by inductive heating at 45 Mhz, the coupling between the induction heating technique, specifically the induction frequency, and the solder alloy is not optimal due to the resistivity of the tin. Typically, nonmagnetic materials, such as tin or copper, may have a magnetic permeability of about 1, and magnetic materials, such as nickel or cobalt, may have a magnetic permeability greater than or equal to about 100. As described above, a higher magnetic permeability may result in a lower skin depth. Similarly, a decrease in the skin depth will increase the induction heating, and lower the required induction frequency. In the present example, an increase in the magnetic permeability by a factor of 100 may decrease the value of the skin depth by a factor of 10 or more. Therefore, the higher the magnetic permeability of the magnetic liner 118, the thinner it may be to achieve the same heating characteristics.

Typical materials used in the construction of a solder bump are not very sensitive to magnetic fields. As described in detail above, localized heating of the solder alloy may be achieved by adding one or more materials that are sensitive to magnetic fields in direct contact with the solder alloy.

Using standard microelectronics fabrication techniques, the magnetic liner 118 can be formed in thermal contact with the solder alloy, as described in detail above, and function as a heat source for melting the solder alloy to form the solder connection. The magnetic liner 118 may be embodied in a variety of configurations in order to tune the inductive heating process and improve coupling efficiency. One configuration suitable for this purpose is illustrated in the structure 100 of FIG. 5. Additional, configurations may be illustrated and described in turn below.

An induction heating technique, as described above, may be used to melt the solder alloy 122 without any enhancement from the magnetic liner 118; however, progressively higher induction frequencies may be required for solder bump sizes equal to or less than 25 µm. If the structure 100 includes the magnetic liner 118, substantially lower induction frequencies may be used to melt the solder alloy 122. For example, the addition of the magnetic liner 118 may allow for induction frequencies equal to or lower than about 17 Mhz may be used to melt the solder alloy 122. Furthermore, there may be a direct correlation between the thickness of the magnetic liner 118 and the required induction frequency. More specifically, a thinner magnetic liner 118, and as such a smaller skin depth may be more efficient and require a lower induction frequency to melt the solder alloy 122 of the structure 100. Therefore, induction frequencies as low as 2 Mhz may be used to melt the solder alloy 122 by optimizing the configuration and thickness of the magnetic liner 118.

The induction heating technique may be tuned and the desired heating characteristics may be achieved by adjusting one of the parameters described above. For example, the desired heating characteristics may be achieved by adjusting the thickness of magnetic liner, adjusting the induction frequency of the magnetic field, or adjusting the time or duration of exposure to the magnetic field.

Figure 6:
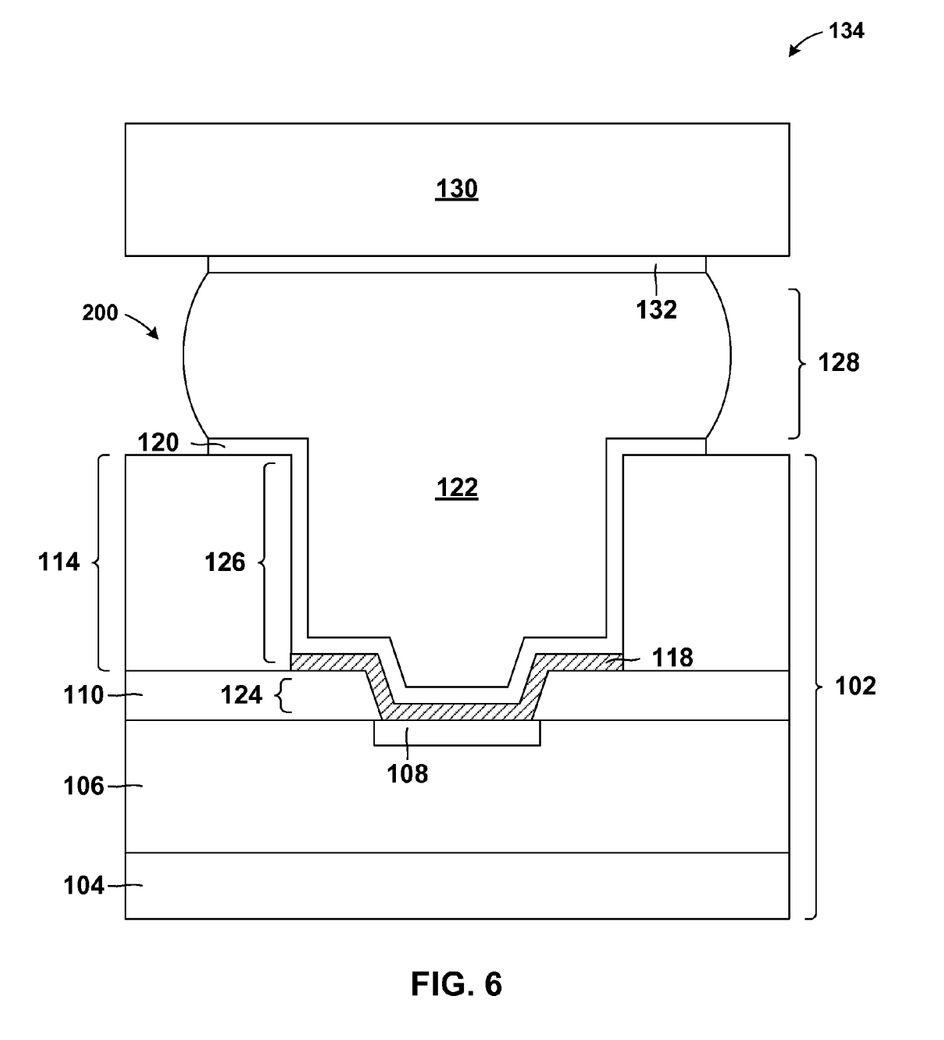
FIG. 6 illustrates a solder connection according to another exemplary embodiment.

Referring now to FIG. 6, a final structure 200 is shown according to an alternative embodiment. It should be noted that the structure 200 is substantially similar to the structure 100, except the magnetic liner 118 of the structure 200 may have an alternative configuration. In the present embodiment, the magnetic liner 118, as illustrated in FIG. 6, may be specifically located at or near the bottom of the solder alloy 122. As positioned, the configuration of the magnetic liner 118 will target heating at or near the bottom of the solder alloy 122.

Like above, the magnetic liner 118 may function as a heat source during formation of the solder connection. In the present example, re-positioning the magnetic liner 118 effectively re-positions the heat source therefore re-configuring heat transfer throughout the package 134. Due to the configuration of the magnetic liner 118, heat will be targeted at or near the bottom of the solder alloy 122 closer to the chip 102 and further from the substrate 130. This may be advantageous in instances, for example, where the chip 102 can tolerate more heat than the substrate 130. In the present example, more heat may conduct into the chip 102 and less heat may conduct into the substrate 103 as compared to the magnetic liner 118 configuration described above with reference to FIGS. 4-5. The above is merely one example of how the magnetic liner 118 can be re-configured to change or tune the heating characteristics of the package 134. For example, the magnetic liner 118 may be positioned along only the sidewall of the solder alloy 122. It should be noted that the configuration of the barrier layer 120 may mimic the configuration of the magnetic liner 118, such that alloying is prevented as described above.

Figure 7:
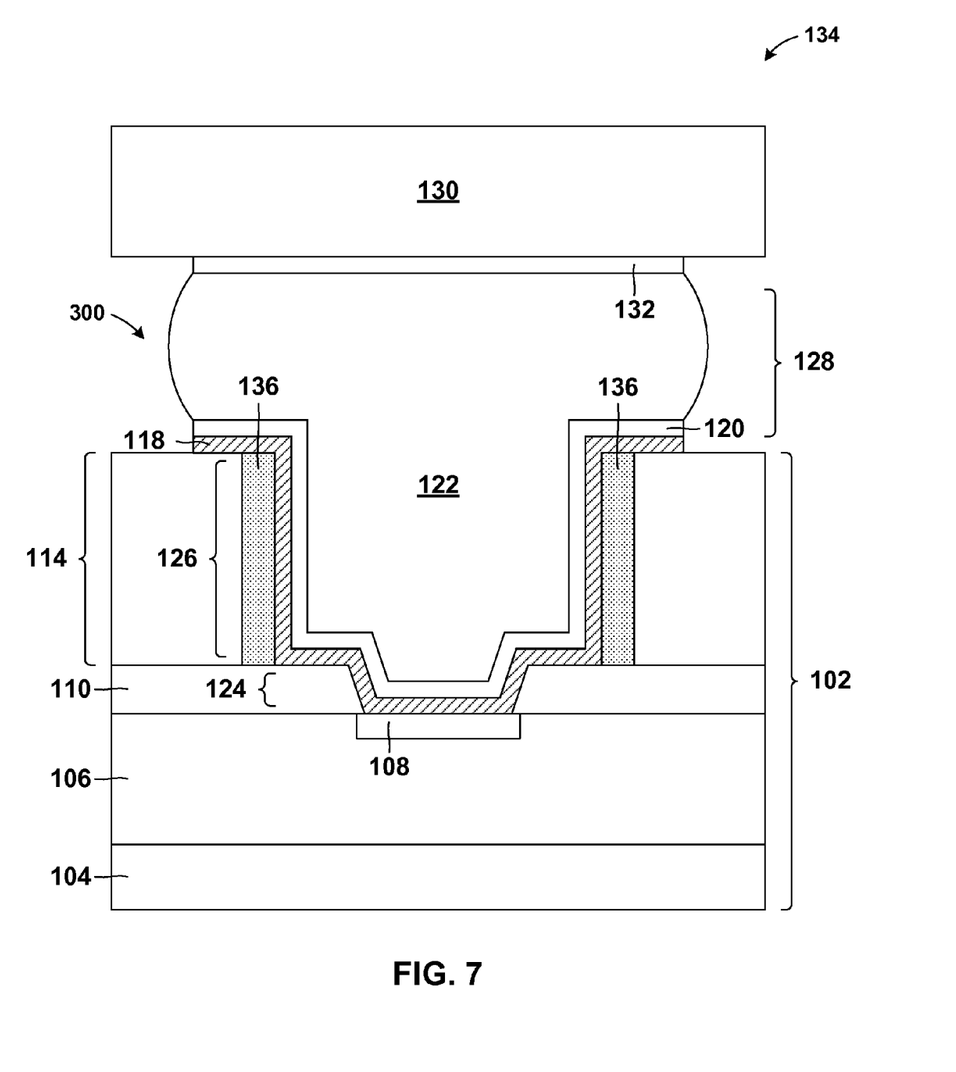
FIG. 7 illustrates a solder connection according to another exemplary embodiment.
Figure 8:
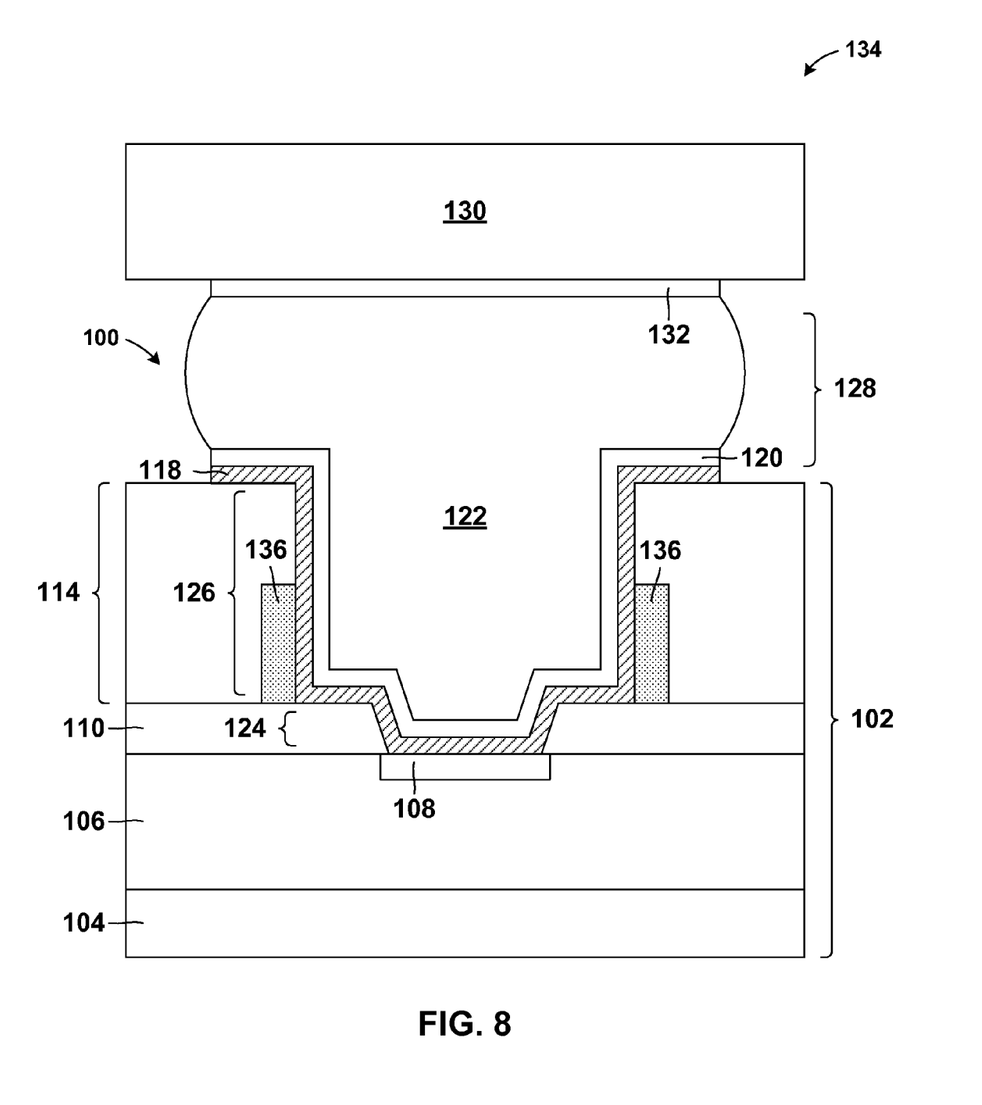
FIG. 8 illustrates a solder connection according to another exemplary embodiment.
Figure 9:
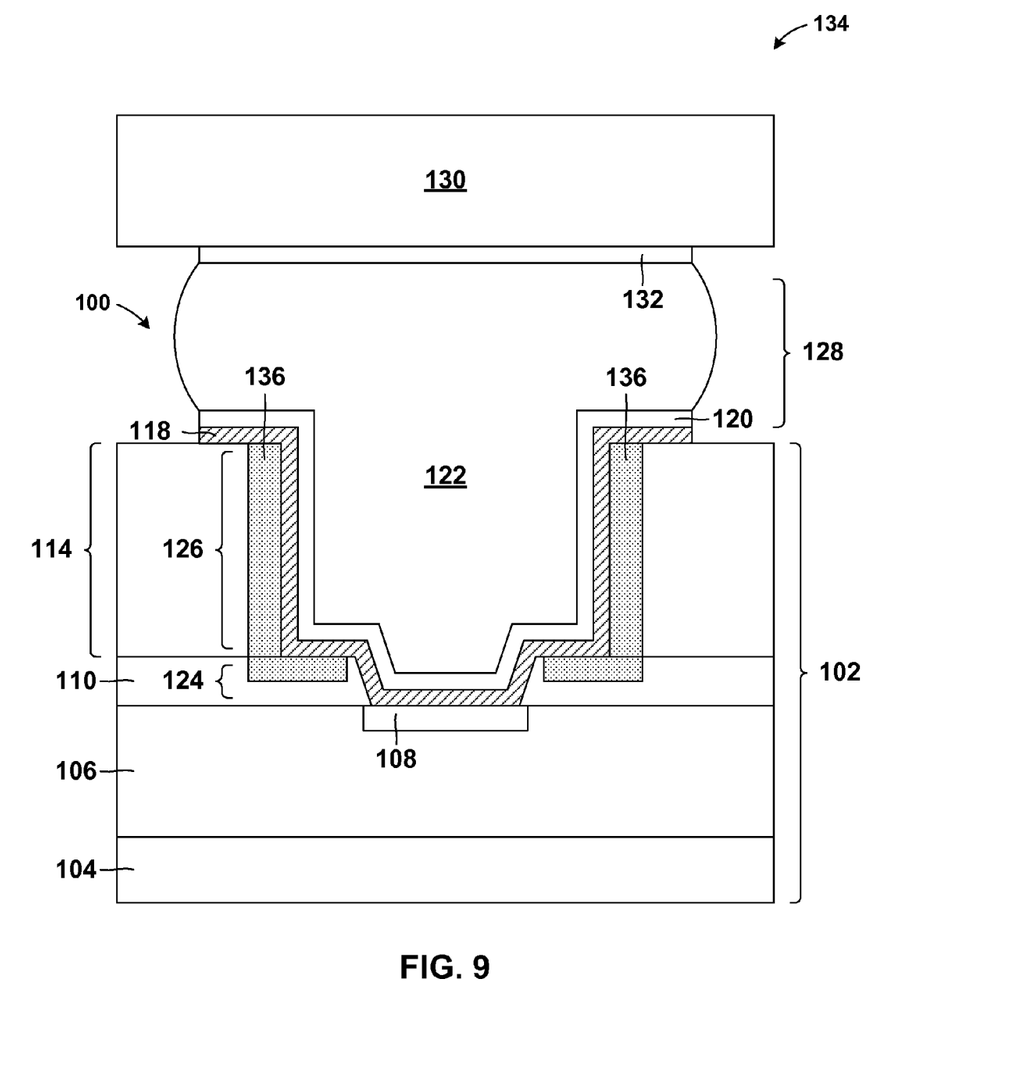
FIG. 9 illustrates a solder connection according to another exemplary embodiment.

According to another embodiment, one way to achieve localized heating of the solder bumps may include supplementing the structural configuration of the solder bumps with a conductive collar used in conjunction with an induction heating technique. One embodiment by which to achieve localized heating of the solder bumps is described in detail below by referring to the accompanying drawings FIGS. 7-9. FIGS. 7-9 each illustrate a variation of the present embodiment.

Referring now to FIG. 7, a final solder bump structure 300 (hereinafter "structure") is shown. Like the structure 100 described above, the structure 300 may include the chip 102 including the substrate 104, the BEOL level 106, the conductive pad 108, and the first dielectric layer 110. Also like above, the structure 300 may include the second dielectric layer 114 patterned to create the second opening 116 (FIG. 3). Furthermore, the structure 300 may also be subdivided for descriptive purposes to include the first portion 124, the second portion 126, and the third portion 128.

According to the present embodiment, a conductive collar 136 may be fabricated along the entire sidewall of the second opening 116, as illustrated. The conductive collar 136 may include a single layer, as illustrated; however the conductive collar 136 may alternatively include multiple layers of the same or of different conductive materials. The conductive collar 136 may include any suitable material that has a high capture rate of inductive energy, for example, carbon, nickel, cobalt, or any suitable combination thereof. Suitable conductive materials may include those with a relatively high resistance for the purpose of efficient heating when exposed to a magnetic field. Suitable conductive materials may also include materials that may be formed along the sidewall of the second opening 116 (FIG. 3) without damaging or compromising the functionality of the structure 300 existing at the time of fabrication. In an embodiment, the conductive collar 136 may have a lateral thickness ranging from about 0.01 µm to about 10 µm. The lateral thickness of the conductive collar 136 may extend perpendicular from the sidewall of the second opening 116 (FIG. 3). The lateral thickness of the conductive collar 136 may be increased or decrease to achieve the effective desired heating characteristics. Like with the magnetic liner 118 above, there may be a direct correlation between the lateral thickness of the conductive collar 136 and the required induction frequency.

The conductive collar 136 may be fabricated using any technique known to a person of ordinary skill in the art. For example, the conductive collar 136 may be fabricated similar to that of a gate spacer of a transistor structure. More specifically, the conductor collar 136 may be fabricated by conformally depositing or growing the chosen conductive material, followed by an anisotropic etch that removes the conductive material from the horizontal surfaces of the structure 300, while leaving it on the sidewalls of the second opening 116 (FIG. 3).

Similar to the magnetic liner 118 above, physical positioning and physical proximity of the conductive collar 136 to the solder alloy 122 may be tuned to achieve the desired heating characteristics. In the present example, the conductive collar 136 may be implemented in combination with the magnetic liner 118 to further enhance and fine tune the heating characteristics from the previous embodiments described above. Alternatively, the conductive collar 136 may be implemented alone without the use of the magnetic liner 118. The conductive collar may or may not be in direct contact with the solder alloy 122. Preferably, the barrier layer 120 may be positioned or located between the conductive collar 136 and the solder alloy 122 to prevent, as described above, any alloying between the conductive collar 136 and the solder alloy 122.

As implied by its name, the conductive collar 136 may preferably wrap around or surround the solder alloy 122. More specifically, the conductive collar 136 of the present embodiment may preferably wrap around the second portion 126 of the structure 300. In an embodiment, the conductive collar 136 may be positioned or configured along only a portion of the sidewall of the solder alloy 122, as illustrated in FIG. 8. For example, the conductive collar 136 may wrap around a lower portion or an upper portion of the second portion 126 of the structure 300. In another embodiment, may extend into the first dielectric layer 110 and beneath the second portion 126 of the structure 300, as illustrated in FIG. 9. The above are intended to be non-limiting examples of how the conductive collar 136 can be configured to change or tune the heating characteristics of the package 134.

In an embodiment, the conductive collar 136 may include carbon as it is generally very resistive and may heat well when exposed to an appropriate induction frequency of an oscillating magnetic field. As above, any thermally conductive material may be used; however materials having a resistivity higher than usual metallic materials are most effective and efficient and as such are preferable. Generally, the higher resistance of the chosen material may improve or enhance power distribution and thus improve the materials heating characteristics.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of applying inductive heating to join an integrated circuit chip to an electrical substrate, the method comprising:
   applying a magnetic field to a magnetic liner in thermal contact with a solder bump on the integrated circuit chip, the magnetic field causes Joule heating in the magnetic liner sufficient to melt the solder bump, the solder bump comprising a lower portion embedded in a first dielectric layer and an upper portion at least partially embedded in a second dielectric layer, the lower portion is in electrical contact with a conductive pad, the first dielectric layer is above the conductive pad and the second dielectric layer is on top of the first dielectric layer; and
   controlling a duration of application of the magnetic field to achieve a joining temperature that is approximately halfway between a storage temperature of the integrated circuit chip and an operating temperature of the integrated circuit chip.

2. The method of claim 1, further comprising:
   adjusting a thickness of the magnetic liner to enable efficient coupling with the magnetic field to achieve the joining temperature.

3. The method of claim 1, the joining temperature approximately halfway between the storage temperature of the integrated circuit chip and the operating temperature of the integrated circuit chip being approximately 75° C.

4. The method of claim 1, the magnetic liner having a magnetic permeability that is sufficiently high to melt the solder bump using an induction frequency equal to or lower than about 17 Mhz.

5. The method of claim 1, the magnetic liner comprising nickel, cobalt, or iron.

6. The method of claim 1, the magnetic liner being in direct contact with the first dielectric layer, the second dielectric layer, and the conductive pad, and the magnetic liner surrounding a perimeter surface of the upper portion and the lower portion of the solder bump separating the solder bump from the first dielectric layer, the second dielectric layer, and the conductive pad.

7. The method of claim 1, the magnetic liner being positioned between the solder bump and the conductive pad, between the solder bump and the first dielectric layer, and between the solder bump and the second dielectric layer, and a portion of the magnetic liner being in direct contact with an upper surface of the second dielectric layer.

8. The method of claim 1, the magnetic liner being positioned between the solder bump and the conductive pad, between the solder bump and the first dielectric layer, and not between the solder bump and the second dielectric layer.

9. The method of claim 1, the applying of the magnetic field to the magnetic liner comprising:
   applying a magnetic field to a conductive collar in thermal contact with the solder bump, the conductive collar surrounding the upper portion of the solder bump.

10. A method of applying inductive heating to join an integrated circuit chip to an electrical substrate, the method comprising:
    providing the integrated circuit chip, the integrated circuit chip comprising:
       a conductive pad;
       a first dielectric layer above the conductive pad and having a first opening extending vertically to the conductive pad;
       a second dielectric layer above the first dielectric layer and having a second opening aligned above and wider than the first opening;
       a magnetic liner lining the first opening and the second opening;
       a barrier layer on the magnetic liner, the barrier layer comprising a titanium layer, a titanium nitride layer, a tantalum layer, a tantalum nitride layer or a tungsten layer; and
       a solder bump immediately adjacent to the barrier layer and filling the first opening, the second opening and further extending above an upper surface of the second dielectric layer, the magnetic liner being in thermal contact with a bottom and a sidewall of the solder bump through the barrier layer and the barrier layer preventing alloying of materials of the magnetic liner and the solder bump;

applying a magnetic field to the magnetic liner, the magnetic field causes Joule heating in the magnetic liner sufficient to melt the solder bump; and controlling a duration of application of the magnetic field to achieve a joining temperature that is approximately halfway between a storage temperature of the integrated circuit chip and an operating temperature of the integrated circuit chip.

11. The method of claim 10, further comprising:
adjusting a thickness of the magnetic liner to enable efficient coupling with the magnetic field to achieve a desired joining temperature.

12. The method of claim 10, the magnetic liner having a magnetic permeability that is sufficiently high to melt the solder bump using an induction frequency equal to or lower than about 17 Mhz.

13. The method of claim 10, the magnetic liner comprising a cobalt liner.

14. The method of claim 10, the magnetic liner comprising an iron liner.

15. The method of claim 10, the magnetic liner further being on the upper surface of the second dielectric layer.

16. A method of applying inductive heating to join an integrated circuit chip to an electrical substrate, the method comprising:
providing the integrated circuit chip and the electrical substrate,
the integrated circuit comprising:
a conductive pad;
a first dielectric layer above the conductive pad and having a first opening extending vertically to the conductive pad;
a second dielectric layer above the first dielectric layer, thicker than the first dielectric layer, comprising a polyimide dielectric material or an organic dielectric material and having a second opening aligned above and wider than the first opening;
a magnetic liner lining the first opening and the second opening, the magnetic liner comprising a cobalt liner;
a barrier layer on the magnetic liner; and
a solder bump on the barrier layer and filling the first opening, the second opening and further extending above an upper surface of the second dielectric layer, the magnetic liner being in thermal contact with a bottom and a sidewall of the solder bump through the barrier layer and the barrier layer preventing alloying of materials of the magnetic liner and the solder bump, and
the electrical substrate comprising a bonding pad positioned immediately adjacent to the solder bump;

applying a magnetic field to the magnetic liner, the magnetic field causes Joule heating in the magnetic liner sufficient to melt the solder bump and create a solder connection between the integrated circuit chip and the electrical substrate; and controlling a duration of application of the magnetic field to achieve a joining temperature that is approximately halfway between a storage temperature of the integrated circuit chip and an operating temperature of the integrated circuit chip, the joining temperature that is approximately halfway between the storage temperature of the integrated circuit chip and the operating temperature of the integrated circuit chip minimizing strain on the solder bump caused by a mismatch between coefficients of thermal expansion of the integrated circuit chip and the electrical substrate during cooling to the storage temperature after the application of the magnetic field.

17. The method of claim 16, further comprising:
adjusting a thickness of the magnetic liner to enable efficient coupling with the magnetic field to achieve the joining temperature.

18. The method of claim 16, the magnetic liner having a magnetic permeability that is sufficiently high to melt the solder bump using an induction frequency equal to or lower than about 17 Mhz.

19. The method of claim 16, the barrier layer comprising a titanium layer, a titanium nitride layer, a tantalum layer, a tantalum nitride layer or a tungsten layer.

20. The method of claim 16, the joining temperature that is approximately halfway between the storage temperature of the integrated circuit chip and the operating temperature of the integrated circuit chip being approximately 75° C.

* * * * *